(12) United States Patent
Imai et al.

(10) Patent No.: US 6,451,110 B2
(45) Date of Patent: Sep. 17, 2002

(54) PROCESS FOR PRODUCING A PLANAR BODY OF AN OXIDE SINGLE CRYSTAL

(75) Inventors: Katsuhiro Imai, Nagoya; Akihiko Honda, Aichi Pref.; Minoru Imaeda, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/799,309

(22) Filed: Mar. 5, 2001

(30) Foreign Application Priority Data

Mar. 9, 2000 (JP) ........................................ 2000-065123

(51) Int. Cl.$^7$ ................................................. C30B 7/10
(52) U.S. Cl. ........................................... 117/81; 117/83
(58) Field of Search .............................. 117/16, 17, 25, 117/26, 81, 83

(56) References Cited

U.S. PATENT DOCUMENTS

| | | | | |
|---|---|---|---|---|
| 3,977,071 A | * | 8/1976 | Jarman | 437/67 |
| 4,108,685 A | * | 8/1978 | Chang et al. | 438/415 |
| 4,128,616 A | * | 12/1978 | Coldren et al. | 310/328 |
| 4,170,490 A | * | 10/1979 | Anthony et al. | 117/40 |
| 5,690,734 A | | 11/1997 | Imaeda et al. | 117/16 |
| 5,961,720 A | | 10/1999 | Imaeda et al. | |

FOREIGN PATENT DOCUMENTS

| | | |
|---|---|---|
| EP | 0 733 728 A2 | 9/1996 |
| EP | 0 737 884 A2 | 10/1996 |
| FR | 2 321 326 A | 3/1977 |
| JP | 8-319191 | 12/1996 |

OTHER PUBLICATIONS

K. Kitamura, et al., "Stoichiometric LiNbO$_3$ Single Crystal Growth by Double Crucible Czochralski Method Using Automatic Powder Supply System," Journal of Crystal Growth, vol. 116 (1992), pp. 327–332.

D.H. Yoon, et al., "Morphological Aspects of Potassium Lithium Niobate Crystals with Acicular Habit Grown by the Micro–Pulling–Down Method," Journal of Crystal Growth, vol. 144 (1994), pp. 207–212.

Rudd et al.: "Growth of Lithium Tantalate . . . " Solid State Technology., vol. 17, No. 1, Jan. 1974, pp. 52–55, XP002171183 Cowan Publ. Corp. Washington, US ISSN: 0038–111X.

Chani V I et al.: "Segregation and Uniformity of K$_3$Li$_2$(Ta, Nb)$_5$O$_{15}$ Fiber Crystals Grown by Micro–pulling–down Method" Journal of Crystal Growth,NL, North Holland Publishing Co. Amsterdam, vol. 194, No. 3/04, Dec. 1998, pp. 374–378, XP000669101 ISSN: 0022–0248.

Patent Abstracts of Japan, vol. 1997, No. 04, Apr. 30, 1997 & JP 08 319191 A, Dec. 3, 1996.

* cited by examiner

*Primary Examiner*—Felisa Hiteshew
(74) *Attorney, Agent, or Firm*—Burr & Brown

(57) ABSTRACT

A planar body with a good crystallinity is grown continuously and stably when a planar body of an oxide single crystal is grown by a micro pulling-down method. A raw material of the oxide single crystal is melted in a crucible 7. A planar seed crystal 15 is contacted to a melt 18, and then the melt 18 is pulled down from an opening 13c of the crucible 7 by lowering the seed crystal. A planar body 14 is produced following the seed crystal 15. In this case, differences in lattice constants between each crystal axis of the seed crystal 15 and each corresponding crystal axis of the planar body 14 is controlled at 0.1% or less, respectively.

2 Claims, 2 Drawing Sheets

PROCESS FOR PRODUCING A PLANAR BODY OF AN OXIDE SINGLE CRYSTAL

BACKGROUND OF THE INVENTION

1. Field of the Invention

Figure 1:
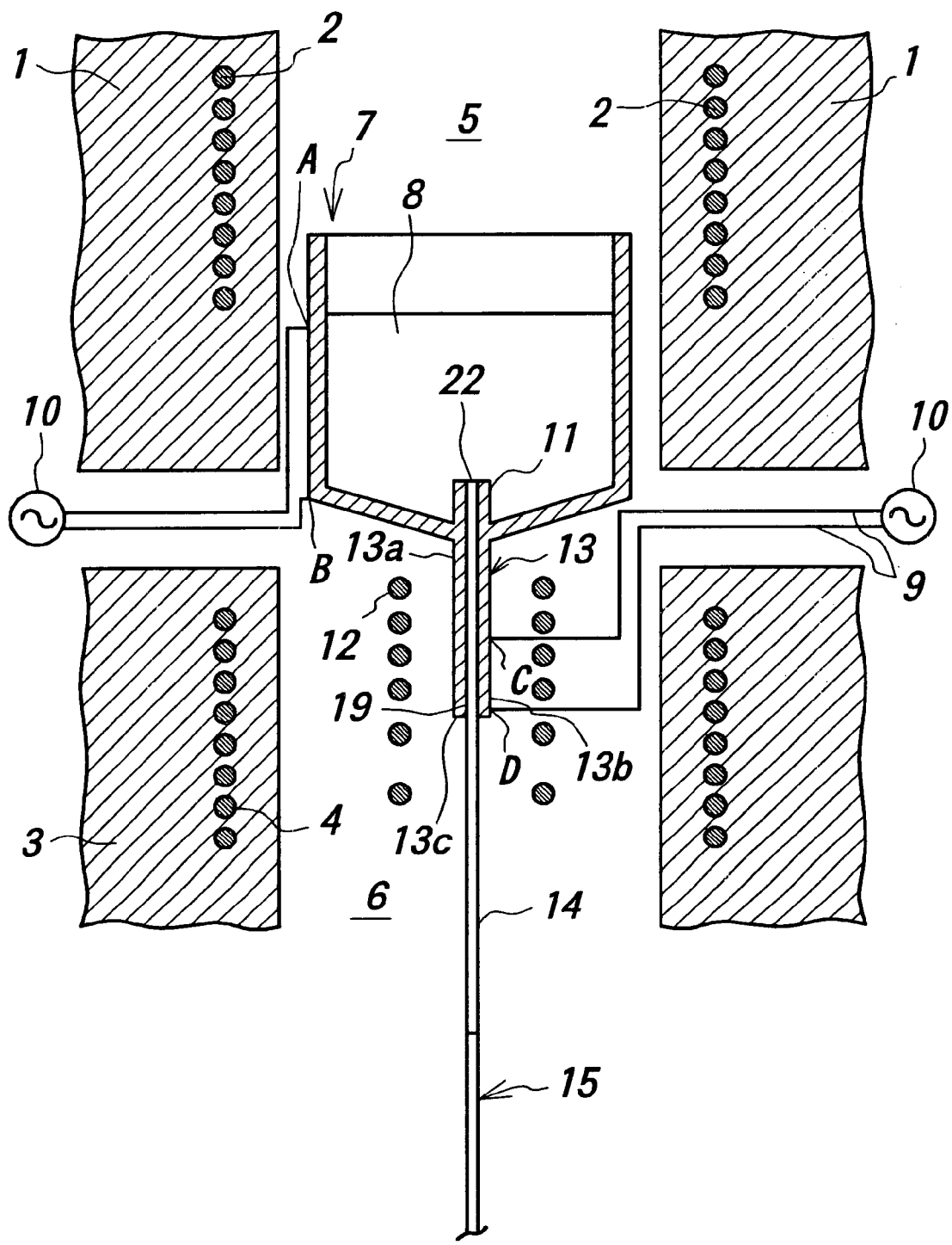

The invention relates to a process for producing a planar body of an oxide single crystal.

2. Description of the Related Art

A single crystal of lithium potassium niobate and a single crystal of lithium potassium niobate-lithium potassium tantalate solid solution have been noted especially as single crystals for blue light second harmonic generation (SHG) device for a semiconductor laser. The device can emit even the ultraviolet lights having the wavelengths of 390 nm or so, thus the crystals can be suitable for wide applications such as optical disk memory, medicine and photochemical fields, and various optical measurements by using such short-wavelength lights. Since the above single crystals have a large electro-optic effect, they can be also applied to optical memory devices using their photo-refractive effect.

However, for an application of a second harmonic generation device, for example, even a small fluctuation in a composition of the single crystal may affect the wavelength of the second harmonic wave generated by the device. Therefore, the specification of the range of the composition required for said single crystals is severe, and the fluctuation in the composition should be suppressed in a narrow range. However, since the composition consists of as many as three of four components, growing a single crystal at a high rate is generally extremely difficult to achieve, while controlling the proportion of the components to be constant.

In addition, for optical applications, especially for an application for the second harmonic wave generation, a laser beam having a short wavelength of, for example, about 400 nm needs to propagate in the single crystal at as a high power density as possible. Moreover, the photo deterioration has to be controlled to the minimum at the same time. In this way, since controlling the photo deterioration is essential, the single crystal has to possess a good crystallinity for this purpose.

Moreover, lithium niobate and lithium potassium niobate can be substituted between cations, thus solid solution in which the cations are solid-solved is produced. Therefore, controlling the composition of the melt needs to grow a single crystal of a specific composition. From such a background, a double crucible method and a method of growing a crystal while feeding raw materials have been examined mainly for the CZ method and the TSSG method. For example, Kitamura et al. tried to grow a lithium niobate single crystal of a stoichiometric composition by combining an automatic powder feeder to a double crucible CZ method (J. Crystal Growth, 116 (1992), p.327). However, it was difficult to enhance a crystal growth rate with these methods.

NGK Insulators, Ltd. suggested a micro pulling-down method for growing the above single crystal with a constant compositional proportions, for example, in JP-A-8-319191. In this method, a raw material, for example, comprising lithium potassium niobate is put into a platinum crucible and melted, and then the melt is pulled down gradually and continuously through a nozzle attached to the bottom of the crucible. The micro pulling-down method can grow a single crystal more rapidly than the CZ method or the TSSG method does. Moreover, the compositions of the melt and the grown single crystal can be controlled by growing the single crystal continuously with feeding the raw materials for growing the single crystal to the raw material melting crucible.

SUMMARY OF THE INVENTION

However, there is still a limitation in using a micro pulling-down method to grow a good single crystal plate (a planar body of a single crystal) continuously at a high rate. Because, when the planar body of the single crystal is pulled down with the seed crystal plate, cracks tend to occur near an interface boundary between the seed crystal and the planar body.

It is an object of the invention to prevent cracks occurring near the interface boundary between a seed crystal and a planar body and to grow a planar body of an oxide single crystal having a good crystallinity continuously and stably, when the planar body of the oxide single crystal is grown with the micro pulling-down method.

The inventors had examined various methods to grow planar bodies of oxide single crystals, which use the micro pulling-down method. As a result, the inventors found that cracks were likely to occur when a difference in lattice constant between the seed crystal and the planar body was large. Thus, the planar body having a good crystallinity may be continuously made by contacting a planar seed crystal to a melt, pulling down the melt from an opening of a crucible by lowering the seed crystal, forming a planar body following the seed crystal, and controlling difference in lattice constant between each of crystal axes of the seed crystal and corresponding crystal axes of the planar body at 0.1% or less, respectively.

In this case, the lattice constant of each crystal axis of the planar body can be adjusted by controlling the proportions of the respective components in the crucible. Taking lithium potassium niobate, for example, the lattice constant of each crystal axis in the grown planar body can be changed by slightly changing a relative ratio of niobium, lithium and potassium in the crucible.

Preferably, the differences between the lattice constants of the planar body and the respective ones of the planar seed crystal are further reduced as the width of the planar body become large. Specifically, when the width of the planar body is 30–50 mm, it is more preferable to control the differences between the corresponding lattice constants at 0.06% or less. When the width of the planar body is 50 mm or more, it is more preferable to control the differences of the lattice constants at 0.04% or less.

Figure 2A:
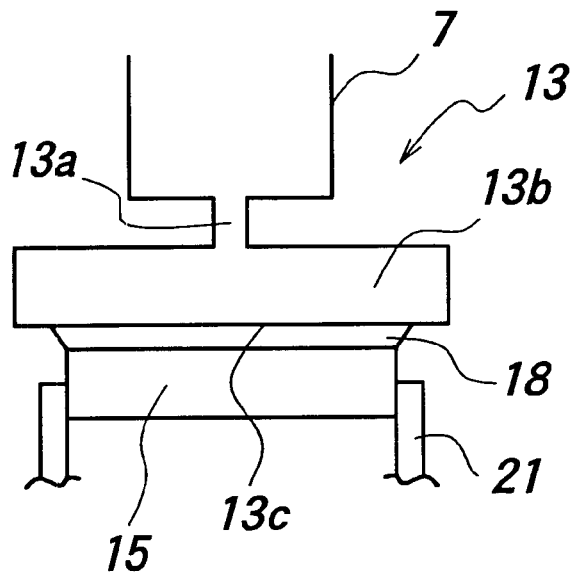

FIG. 1 is a schematic sectional view of a manufacturing apparatus for growing a single crystal. FIGS. 2(a) and (b) represent steps of pulling down a planar body of the single crystal.

A crucible 7 is placed in a furnace body. An upper furnace unit is arranged to surround the crucible 7 and an upper space 5 thereof, and has a heater 2 buried therein. A nozzle 13 extends downwardly from a bottom part of the crucible 7. The nozzle 13 comprises a connecting-tube portion 13a and a planar expanded portion 13b at the lower end of the connecting-tube portion 13a. In FIG. 1, only a cross sectional view of the planar expanded portion 13b is shown. The connecting-tube portion 13a and the planar expanded portion 13b can be changed variously in shape. Both 13a and 13b can also be arbitrarily changed in combination. A slender opening 13c is formed at the lower end of the planar expanded portion 13b, and a vicinity of the opening 13c is a single crystal-growing portion 19. A lower furnace unit 3 is arranged to surround the nozzle 13 and a surrounding space 6 thereof, and has a heater 4 buried therein. The crucible 7 and the nozzle 13 are both formed from a corrosion-resistant conductive material.

One electrode of a power source 10 is connected to a point A of the crucible 7 with an electric cable 9, and the other electrode of the power source 10 is connected to a lower bent B of the crucible 7. One electrode of an another power source 10 is connected to a point C of the connecting-tube portion 13a with an electric cable 9, and the other electrode of the power source 10 is connected to a lower end D of the planar expanded portion 13b. These current-carrying systems are isolated from each other and configured to control their voltages independently.

An after-heater 12 is located in the space 6 to surround the nozzle 13 with a distance. An intake tube 11 extends upwardly in the crucible 7 and an intake opening 22 is provided at the upper end of the intake tube 11. The intake opening 22 slightly protrudes from a bottom portion of a melt 8.

The upper furnace unit 1, the lower furnace unit 3 and the after-heater 12 are allowed to heat for setting an appropriate temperature distribution in each of the space 5 and space 6. Then a raw material for the melt is supplied into the crucible 7 and the electricity is supplied to the crucible 7 and the nozzle 13 for heating. In this condition, the melt slightly protrudes from the opening 13c at the single crystal-growing portion 19.

Figure 2B:
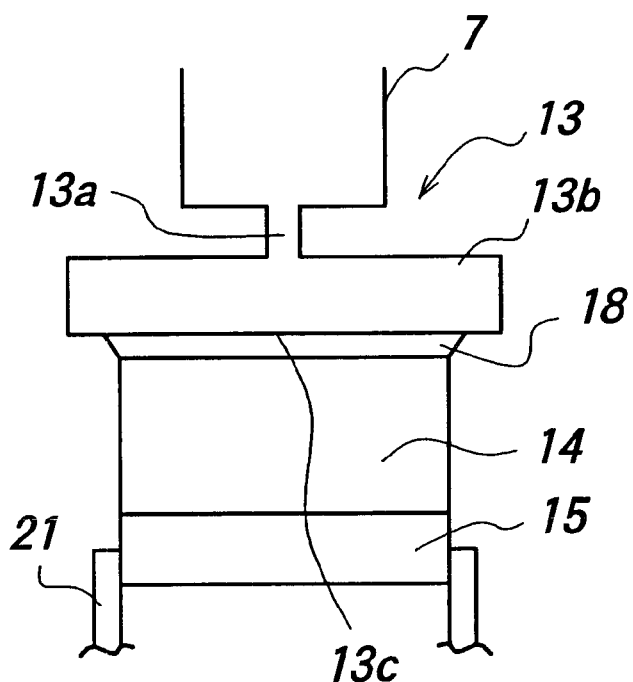

In this condition, a planar seed crystal 15 is held with a holder 21 at both side faces and moved upwardly as shown in FIG. 2(a), and the upper surface of the seed crystal 15 is contacted with the melt protruding from the opening 13c. At that time, a uniform solid phase-liquid phase interface (meniscus) is formed between the upper end of the seed crystal 15 and the melt 18 pulled downwardly from the nozzle 13. Then, the seed crystal 15 is lowered as shown in FIG. 2(b). As a result, a planar body 14 is continuously formed on an upper side of the seed crystal 15 and pulled downwardly.

The lattice constant is measured by an X-ray diffraction apparatus (MRD diffractometer, manufactured by Philips). If an unequivalent crystal axis exists in an oxide single crystal, differences in lattice constants between each crystal axis of the seed crystal and each corresponding axis of the planar body, respectively, have to be 0.1% or less.

An oxide single crystal is not particularly limited, but, for example, lithium potassium niobate (KLN), lithium potassium niobate-lithium potassium tantalate solid solution (KLTN: [$K_3Li_{2-x}(Ta_yNb_{1-y})_{5+x}O_{15+2x}$]) lithium niobate, lithium tantalate, litium niobate-lithium tantalate solid solution, $Ba_{1-x}Sr_xNb_2O_6$, Mn–Zn ferrite, yttrium aluminum garnet substituted with Nd, Er and/or Yb, YAG, and $YVO_4$ substituted with Nd, Er, and/or Yb can be exemplified.

EXAMPLE 1

With a single crystal-producing apparatus shown in FIG. 1, a planar body of a lithium potassium niobate single crystal was produced according to the invention. Specifically, the temperature of the whole furnace was controlled by the upper furnace unit 1 and the lower furnace unit 3. The apparatus was configured to be able to control the temperature gradient near the single crystal-growing portion 19 by an electric supply to the nozzle 13 and the heat generation of the after-heater 12. A mechanism of pulling down the single crystal plate was equipped, in which a single crystal plate was pulled down with controlling the pulling-down rate uniformly within a range from 2 to 100 mm/hour in a vertical direction.

A planar seed crystal 15 of lithium potassium niobate was used. A size of the seed crystal 15 was 30 mm×1 mm in cross-section and 5 mm in length. Lattice constants of the seed crystal 15 were 12.568 Å in a-axis and 4.031 Å in c-axis. The molar ratio of potassium, lithium and niobium was 30: 18.2:51.8. A half width of an X-ray rocking curve was 60 seconds at 0 0 4 reflection of the seed crystal (measured by the MRD diffractometer, manufactured by Philips).

Potassium carbonate, lithium carbonate and niobium pentoxide were prepared at a molar ratio of 30:26:44 to produce a raw material powder.

The raw material was supplied into the platinum crucible 7, and the crucible 7 was set in place. With controlling the temperature of the space 5 in the upper furnace unit 1 within a range from 1100 to 1200° C., the raw material in the crucible 7 was melted. The temperature of the space 6 in the lower furnace unit 3 was controlled uniformly within a range from 500 to 1000° C. While a given electric power was supplied to each of the crucible 7, the nozzle 13 and the after-heater 12, a single crystal was grown. In this case, the temperature of the single crystal growing portion could be at 980–1150° C., and the temperature gradient of the single crystal growing portion could be controlled at 10–150° C./mm.

The crucible 7 had an elliptical cross-sectional shape, wherein the major axis, the minor axis and the height was 50 mm, 10 mm and 10 mm, respectively. The length of the connecting-tube portion was 5 mm. A cross-sectional dimension of the planar expanded portion 13b was 1 mm×50 mm. A dimension of the opening 13c was 1 mm long×50 mm wide. Under such conditions, the seed crystal 15 was pulled down at a rate of 10 mm/hour.

While the raw material in equal weight to that of the crystallized melt was being fed to the crucible 7, the crystal was kept growing, and the planar body 14 was cut off from the nozzle 13 and cooled when the length of the planar body 14 reached 50 mm. The lattice constant of the obtained planar body was measured to give the a-axis length of 12.569 Å and the c-axis length of 4.029 Å. A molar ratio of potassium, lithium and niobium was 30:18.1:51.9, respectively. A difference between the lattice constant of the planar seed crystal 15 and that of the planar body 14 (lattice mismatch) was 0.01% or less in a-axis and 0.05% in c-axis. However, no crack occurred at the joining portion between the planar seed crystal 15 and the planar body 14. Also, a half width of an X-ray rocking curve was 40 seconds at 0 0 4 reflection of the planar body.

EXAMPLE 2

Similar results as Example 1 were obtained with a plate of lithium potassium niobate-lithium potassium tantalate solid solution single crystal.

EXAMPLE 3

A planar body of lithium niobate was grown according to Example 1 except that a planar seed crystal 15 of lithium niobate was used. Dimensions of the seed crystal 15 were 50 mm×1 mm in cross-section and 5 mm in length. The seed crystal was cut out and obtained from a stoichiometric lithium niobate single crystal grown by the Czochralski method, wherein a direction of pulling down the seed crystal was set parallel to the X-axis, and a direction of a growing face was set parallel to the Z-axis. A lattice constant of the seed crystal was 5.148 Å in a-axis and 13.857 Å in c-axis. A molar ratio of lithium and niobium was 50:50, respectively. A half width of an X-ray rocking curve was 12 seconds at 0 0 12 reflection of the seed crystal.

Lithium carbonate and niobium pentoxide were prepared at the molar ratio of 58:42 to produce a raw material powder.

The raw material was fed into the platinum crucible 7, and the crucible 7 was arranged in a predetermined place. While a temperature of the space 5 in the upper furnace unit 1 was controlled within a range from 1200 to 1300° C., the raw material in the crucible 7 was melted. A temperature of the space 6 in the lower furnace unit 3 was controlled uniformly within a range from 500 to 1000° C. While a predetermined electric power was supplied to each of the crucible 7, the nozzle 13 and the after-heater 12, a single crystal was grown. In this case, the temperature of the single crystal-growing portion could be at 1200–1250° C., and the temperature gradient of the single crystal growing portion could be controlled at 10–150° C./mm. The seed crystal was lowered at a rate of 30 mm/hour. A volume of the crystallized lithium niobate was measured to convert it to a weight at each unit time internally, and the raw material of lithium niobate in equal weight to the converted one was supplied into the crucible. In this case, unlike the raw material powder melted at the beginning, the lithium niobate powder supplied afterward in such manner was prepared to have a molar ratio of lithium and niobium at 50:50.

As a result, a planar body having the width of 50 mm was formed without a shoulder portion. While the raw material powder of lithium niobate was fed, the crystal was continuously grown until a length of the planar body reached 50 mm. Then the planar body was cut off from the nozzle 13 and cooled.

A composition of the obtained planar body (Z-plate) was measured by an inductively coupled plasma method, and a molar ratio of lithium and niobium was 50:50, which corresponded to the stoichiometry composition. A lattice constant of the planar body was measured to give an a-axis length of 5.148 Å and the c-axis length of 13.858 Å. Differences of lattice constants between the planar body and the seed crystal (lattice mismatch) were 0.01% or less in a-axis and 0.01% or less in c-axis. No cracks occurred at the joining portion between the seed crystal 15 and the planar body 14. A half width of an X-ray rocking curve was 12 seconds at the planar body.

EXAMPLE 4

A planar body (X-plate) was grown according to Example 3 except that the seed crystal was worked so that a direction of pulling down the planar seed crystal might be parallel to the Z-axis, and that a direction of a growing face might be parallel to the X-axis. An a-axis length, a c-axis length and a half width of X-ray rocking curve at the seed crystal and the shoulder portion, were similar to those in Example 3. No cracks also occurred at the joining face between the shoulder portion and the seed crystal.

As mentioned above, according to the invention, when the planar body of the oxide single crystal was grown by the micro pulling-down method, cracks can be prevented near an interface between the seed crystal and the planar body, and the planar body with good crystallinity can be grown continuously and stably.

What is claimed is:

1. A process for producing a planar body of an oxide single crystal, said process comprising the steps of melting a raw material of said oxide single crystal in a crucible, contacting a planar seed crystal to the melt, pulling down said melt from an opening of said crucible by lowering the planar seed crystal, and forming said planar body following said planar seed crystal, wherein differences in lattice constants between each crystal axis of said planar seed crystal and each corresponding crystal axis of said planar body is 0.1% or less, respectively.

2. A process for producing a planar body according to claim 1, wherein said difference between each lattice constant of each crystal axis of said planar seed crystal and each corresponding lattice constant of each corresponding crystal axis of said planar body is adjusted by controlling a proportion of each component in the crucible.

* * * * *